United States Patent [19]

Hiraki et al.

[11] Patent Number: 5,534,800
[45] Date of Patent: Jul. 9, 1996

[54] SENSE AMPLIFIER, SRAM, AND MICROPROCESSOR

[75] Inventors: Mitsuru Hiraki, Hachioji; Yasuhiko Sasaki, Kokubunji; Koichi Seki, Hino; Tatsuji Matsuura, Tokyo, all of Japan

[73] Assignee: Hitachi, Ltd., Tokyo, Japan

[21] Appl. No.: 133,218

[22] Filed: Oct. 7, 1993

[30]   Foreign Application Priority Data

Oct. 7, 1992 [JP] Japan ..................................... 4-268263

[51] Int. Cl.$^6$ ................................................. G11C 7/00
[52] U.S. Cl. ............................... 327/57; 327/51; 365/205
[58] Field of Search ................................. 307/530, 290, 307/279; 365/205, 207, 189.07; 327/50, 51, 57

[56]   References Cited

U.S. PATENT DOCUMENTS

| 4,441,771 | 4/1984 | Hoffmann | 307/530 |
|---|---|---|---|
| 4,567,389 | 1/1986 | Van Tran | 307/530 |
| 4,616,148 | 10/1986 | Ochii et al. | 307/530 |
| 4,651,305 | 3/1987 | Davis | 365/205 |
| 4,680,735 | 7/1987 | Miyamoto et al. | 365/205 |
| 5,243,573 | 9/1993 | Makihara et al. | 365/205 |

OTHER PUBLICATIONS

K. Sasaki et al, "A 9-ns 1-Mbit CMOS SRAM", IEEE Journal of Solid-State Circuits, vol. 24, No. 5, Oct. 1989, pp. 1219–1224.
S. Yamamoto, et al., "A 256K CMOS SRAM with Variable-Impedance Loads", ISSCC Digest of Technical Papers, Feb. 1985, pp. 58–59.
A. Sekiyama, et al., "A 1–V Operating 256–kb Full–CMOS SRAM", IEEE Journal of Solid–State Circuits, vol. 27, No. 5, May 1992, pp. 776–782.
Ootani et al., "A 4–Mb CMOS SRAM with a PMOS Thin–Film–Transistor Load Cell", IEEE Journal of Solid-State Circuits, vol.25, No. 5, Oct 1990, pp. 1082–1092.

Primary Examiner—Timothy P. Callahan
Assistant Examiner—T. Lam
Attorney, Agent, or Firm—Antonelli, Terry, Stout & Kraus

[57]   ABSTRACT

A sense amplifier for an SRAM providing both a small power consumption and a high speed sensing operation. The sense amplifier includes a first p-channel MOSFET having a source terminal connected to a bit line, a second p-channel MOSFET having a source terminal connected to another bit line, a first n-channel MOSFET having a drain terminal connected to a drain terminal of the first p-channel MOSFET and a gate terminal connected to a drain terminal of the second p-channel MOSFET and to a gate terminal of the first p-channel MOSFET, a second n-channel MOSFET having a drain terminal connected to a drain terminal of the second p-channel MOSFET, a gate terminal connected to a drain terminal of the first p-channel MOSFET and to a gate terminal of the second p-channel MOSFET, and a source terminal connected to a source terminal of the first n-channel MOSFET, a third p-channel MOSFET for controlling the connection/disconnection between a first power source (Vcc) and the drain terminal of the first p-channel MOSFET, a fourth p-channel MOSFET for controlling the connection/disconnection between the first power source Vcc and the drain terminal of the second p-channel MOSFET, and a third n-channel MOSFET for controlling the connection/disconnection between a second power source (ground) and the source terminals of the second n-channel MOSFETs.

15 Claims, 13 Drawing Sheets

VOLTAGE WAVEFORMS

VOLTAGE WAVEFORMS

BIT LINE DIAGRAM

MEMORY CELL DIAGRAM

VOLTAGE SWING REDUCTION BY $V_{bias}$

VOLTAGE SWING REDUCTION BY MOSFET THRESHOLD VALUE

VOLTAGE WAVEFORM

φAi GENERATOR

φSA GENERATOR

F I G. 13A
| INPUT Ai | INPUT Ai' | OUTPUT φAi |
|---|---|---|
| 0 | 0 | 1 |
| 0 | 1 | 0 |
| 1 | 0 | 0 |
| 1 | 1 | 1 |
F I G. 13B
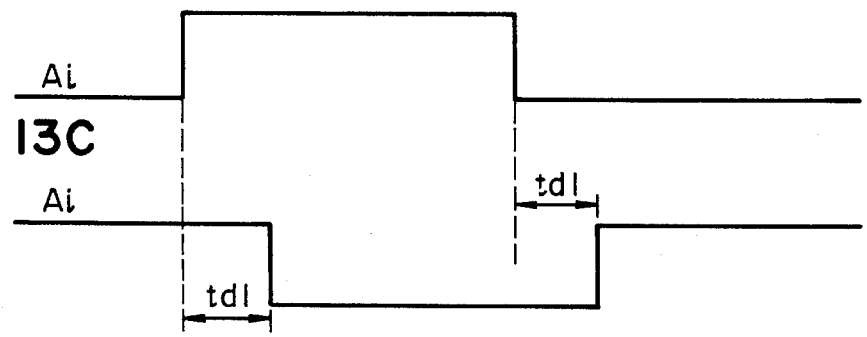
F I G. 13C
F I G. 13D
F I G. 13E
F I G. 14
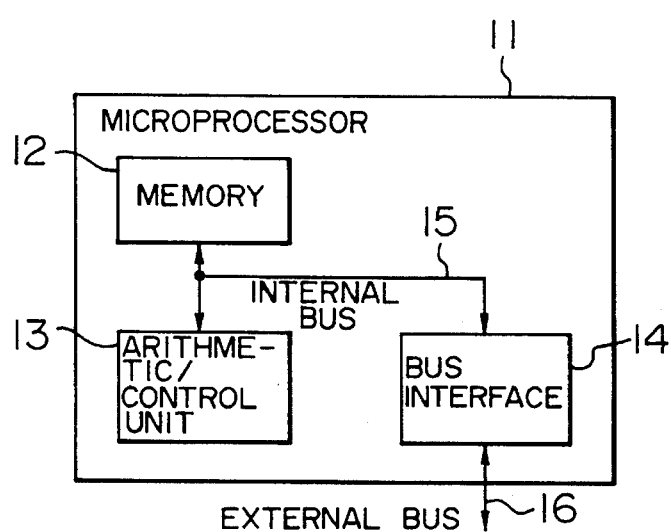

SENSE AMPLIFIER, SRAM, AND MICROPROCESSOR

BACKGROUND OF THE INVENTION

1. Field of the Invention

The present invention relates to a low power consumption and high speed sense amplifier, an SRAM using such a sense amplifier, and a microprocessor assembled with such an SRAM.

2. Description of the Related Art

In an SRAM, a plurality of memory cells are connected to a plurality of bit lines (BL, /BL). Each memory cell is connected to one of a plurality of word lines (WL) disposed in the direction perpendicular to the bit lines. One word line selected by a decoder is set to a high level, and the other word lines are set to a low level. A selected memory cell outputs a voltage signal equal to a power supply voltage, to one of its bit lines BL and /BL and a voltage signal slightly lower than the power supply voltage to the other bit line, in accordance with the binary information stored in the selected memory cell. The data ("1" or "0") stored in the memory cell selected by the decoder circuit appears as having an extremely small voltage difference between the pair of bit lines connected to the cell. This voltage difference is generally in the range of several tens mV to one hundred mV. If the data of a memory cell is "1", the potential at BL is higher than /BL, and if the data is "0", the potential at BL is lower than /BL. A sense amplifier differentially amplifies this small voltage.

FIGS. 2, 3, 4A are circuit diagrams of conventional sense amplifiers for SRAMs.

The sense amplifier shown in FIG. 2 is called a latch type sense amplifier which is described, for example, in an article entitled "A 9-ns 1-Mbit CMOS SRAM", by K. Sasaki et al, IEEE Journal of Solid-State Circuits, Vol. 24, No. 5, October 1989, pp. 1219–1224.

Referring to FIG. 2, a small potential difference between a pair of bit lines BL and /BL is supplied to n-type MOS transistors MN4 and MN5 and outputted from an output node pair OUT and /OUT. Assuming that the level of BL is high, and the level of /BL is low, MN4 eventually turns on and MN5 turns off. Therefore, a high level voltage appears at the output node on the Vcc side of MN5, and a low level voltage appears at the output node on the Vcc side of MN4. This voltage difference is positively fed back by two p-type MOS transistors MP5 and MP6 constituting a latch, and outputted as complementary signals to the output ports OUT and /OUT. While the sense amplifier outputs the complementary signals, a voltage equal to the power supply voltage Vcc is applied to the gate SAC of a transistor MN6 to maintain it on.

The sense amplifier shown in FIG. 3 is called a current Miller type sense amplifier which is described, for example, in an article entitled "A 256K CMOS SRAM with Variable-Impedance Loads", by S. Yamamoto, et al., ISSCC Digest of Technical Papers, February 1985, pp. 58–59.

Referring to FIG. 3, a small potential difference between a pair of bit lines BL and /BL is amplified by the sense amplifier in the same manner described with FIG. 2, and complementary signals are outputted to the output node pair OUT and /OUT. If the level of BL is high and that of /BL is low, MN7 is eventually turned on and MN 10 is turned off. Therefore, a high level voltage appears at the output node on the Vcc side of MN10, and a low level voltage appears at the output node on the Vcc side of MN7. Then, transistors MN8, MP8, and MP7 turn off, and transistors MN9, MP9, and MP10 turn on, by the Miller effect, and the amplified complementary signals are outputted to the output ports OUT and /OUT. A transistor MN11 provides the same function as MN6 shown in FIG. 2.

The sense amplifier shown in FIG. 4A is described, for example, in an article entitled "A 1-V Operating 256-kb Full-cmos sram", by A. Sekiyama, et al., IEEE Journal of Solid-State Circuits, Vol. 27, No. 5, May 1992, pp. 776–782.

FIG. 4A is a circuit diagram of the sense amplifier, and FIG. 4B is a timing chart showing a change of signals with time.

When sense amplifier active signals ΦSA and /ΦSA become high and low, respectively (refer to voltage waveforms shown in FIG. 4B), both transistors MN14 and MP13 turn on so that a latch circuit constituted by transistors MP11, MP12, MN12, and MN13 is made active. A potential difference between bit lines BL and /BL is therefore amplified and outputted to the bit lines BL and /bl. A small potential difference between the bit lines BL and /BL as shown in FIG. 4B eventually turns out to be a GND level voltage on the BL side node of MN13 and a Vcc level voltage on the BL side of MN12 because MN13 and MP11 turn on eventually and MP12 and MN12 turn off eventually. The GND level voltage and Vcc level voltage therefore appear on the bit lines BL and /BL.

In order to speed up the operation of a sense amplifier for SRAMs, plural stage arrangements of sense amplifiers have been used. For example, as shown in FIG. 9, a two stage configuration including local sense amplifiers and a main sense amplifier has been commonly used. As shown in FIG. 9, when a memory cell is selected by a decoder, signals amplified by a local sense amplifier corresponding to the selected block are transferred via a block selector controlled by the decoder circuit to data buses (DB, /DB). The signals on the data buses are then amplified by the main sense amplifier. Such a two stage configuration is described, for example, in an article entitled "A 4-Mb CMOS SRAM with a PMOS Thin-Film-Transistor Load Cell", by T. Ootani et al., IEEE Journal of Solid-State Circuits, Vol. 25, No. 5, October 1990, pp. 1082–1092.

Conventional sense amplifiers, however, have a trade-off between low power consumption and high speed operation. Specifically, the latch type sense amplifier shown in FIG. 2 and the current Miller type sense amplifier shown in FIG. 3 have a large power consumption although they operate at a high speed, whereas the sense amplifier shown in FIG. 4 operates at a low speed although it has a small power consumption.

More specifically, in the sense amplifiers shown in FIGS. 2 and 3, a d.c. current continuously flows while the complementary signals (OUT, /OUT) are outputted, increasing the power consumption. Namely, since the potentials of the bit lines BL and /BL are generally the same during the initial stage, the transistors MN4 and MN5 of the sense amplifier shown in FIG. 2 both turn on, and one of the output node pair OUT and /OUT at a low level thereby turning on one of MP5 and MP6. During the active operation of the sense amplifier, MN6 remains turned on. As a result, a d.c. current always flows either through a current path A or B.

Also in the sense amplifier shown in FIG. 3, because generally have the same potential BL and /BL generally have the same potential during the initial stage, MN7 and MN10 both turn on, and one of the output node pair OUT and /OUT is at a high level thereby turning on MP10 or MP7. During the active operation of the sense amplifier, MN11 remains turned on. As a result, a d.c. current always flows either through a current path C or D.

In the sense amplifier shown in FIG. 4, a d.c. current will not flow after the output levels have been established, resulting in a relatively small power consumption. Namely, when the bit line BL takes a high level (Vcc) and the bit line /BL takes a low level (GND), both MP12 and MN12 turn off and no d.c. current flows. However, during the active operation of the sense amplifier, it is required to drive the bit lines BL and /BL, lowering the sense operation speed. An extremely large number of memory cells are usually connected to the bit lines BL and /BL (refer to FIG. 5A). It is therefore necessary for the sense amplifier to drive a large load (parasitic capacitances of memory cells indicated as C1 and C2 in FIG. 4A).

As described above, the sense amplifiers shown in FIGS. 2 and 3 have a large power consumption, and the sense amplifier shown in FIG. 4A has a relatively slow operation speed. It is difficult for conventional sense amplifiers to obtain both the low power consumption and high speed operation. In the case of a two-stage configuration sense system having a main sense amplifier and local sense amplifiers shown in FIG. 9, data buses DB and /DB are required to be extended in the direction of disposing blocks 1 to N by a considerably long distance, increasing the wiring capacitance. Therefore, a large current I1 will flow when charging/discharging the data busses, resulting in a large power consumption. As a means for reducing the charge/ discharge current I1, it is possible for the block selector to be provided with a circuit for reducing a voltage swing on the data buses. The voltage swing reduction by such a circuit uses a voltage $V_{bias}$ shown in FIG. 10A or a MOS threshold value shown in FIG. 10B. In this case, however, if the sense amplifier shown in FIG. 2 or 3 is used as the main sense amplifier, a d.c. current I2 will flow through the main sense amplifier because, as described previously, a d.c. current will flow if complementary signals having a small potential difference are supplied. As a result, even if the voltage swing reduction on the data buses is effected to reduce the charge/ discharge current I1, the d.c. current I2 of the main sense amplifier increases. The total power consumption of the two-stage sense amplifier cannot, therefore, effectively be reduced.

It is essential to allow the voltages on the data buses DB and /DB to swing fully when the outputs have been established. Therefore, even if the sense amplifier shown in FIG. 4 is used as the main sense amplifier, it is principally impossible to incorporate such a means for reducing a voltage swing on the data buses.

As described so far, even if the voltage swing on the data buses DB and /DB is reduced at the local sense amplifier, the power consumption cannot effectively be reduced if the conventional sense amplifier shown in FIGS. 2 and 3 is used as the main sense amplifier. If the sense amplifier shown in FIG. 4A is used as the main sense amplifier, it is principally impossible to reduce the voltage swing on the data buses.

SUMMARY OF THE INVENTION

It is, therefore a principal object of the present invention to solve the above conventional problems and provide a low power consumption and high speed operation sense amplifier.

It is another object of the present invention to provide an SRAM capable of effectively reducing the total power consumption of the sense system by preventing a d.c. current from flowing through a main sense amplifier even if the swing of a voltage on data buses interconnecting the main sense amplifier and local sense amplifier is reduced.

It is a further object of the present invention to provide a microprocessor having an SRAM and a sense amplifier which can provide a small power consumption and high speed sense operation.

According to one aspect of the present invention, there is provided a sense amplifier for an SRAM including a first p-channel MOSFET having a source terminal connected to a first input signal line, a second p-channel MOSFET having a source terminal connected to a second input signal line, a first n-channel MOSFET having a drain terminal connected to a drain terminal of the first p-channel MOSFET and a gate terminal connected to a drain terminal of the second p-channel MOSFET and to a gate terminal of the first p-channel MOSFET, a second n-channel MOSFET having a drain terminal connected to a drain terminal of the second p-channel MOSFET, a gate terminal connected to a drain terminal of the first p-channel MOSFET and to a gate terminal of the second p-channel MOSFET, and a source terminal connected to a source terminal of the first n-channel MOSFET, a first switching circuit for controlling the connection/ disconnection between a first power source and the source terminal of the first n-channel MOSFET, a second switching circuit for controlling the connection/disconnection between a second power source and the drain terminal of the first p-channel MOSFET, and a third switching circuit for controlling the connection/disconnection between the second power source and the drain terminal of the second p-channel MOSFET.

The first switching circuit includes a third n-channel MOSFET having a drain terminal connected to the source terminal of the first n-channel MOSFET and a source terminal connected to the first power source, the second switching circuit includes a third p-channel MOSFET having a drain terminal connected to the drain terminal of the first p-channel MOSFET and a source terminal connected to the second power source, the third switching circuit includes a fourth p-channel MOSFET having a drain terminal connected to the drain terminal of the second p-channel MOSFET and a source terminal connected to the second power source, and the third n-channel MOSFET, the third p-channel MOSFET, and the fourth p-channel MOSFET, operate in response to a first control signal for making the sense amplifier active, the first control signal being applied to the gate terminals of the third n-channel and p-channel MOSFETs and the fourth p-channel MOSFET.

According to another aspect of the present invention, there is provided a sense amplifier for an SRAM including a first n-channel MOSFET having a source terminal connected to a first input signal line, a second n-channel MOSFET having a source terminal connected to a second input signal line, a first p-channel MOSFET having a drain terminal connected to a drain terminal of the first n-channel MOSFET and a gate terminal connected to a drain terminal of the second n-channel MOSFET and to a gate terminal of the first n-channel MOSFET, a second p-channel MOSFET having a drain terminal connected to a drain terminal of the second n-channel MOSFET, a gate terminal connected to a drain terminal of the first n-channel MOSFET and to a gate terminal of the second n-channel MOSFET, and a source terminal connected to a source terminal of the first p-channel MOSFET, a first switching circuit for controlling the connection/disconnection between a second power source and the source terminal of the first p-channel MOSFET, a second switching circuit for controlling the connection/disconnection between a first power source and the drain terminal of the first n-channel MOSFET, and a third switching circuit for controlling the connection/disconnection between the first power source and the drain terminal of the second n-channel MOSFET.

The first switching circuit includes a third p-channel MOSFET having a drain terminal connected to the source terminal of the first p-channel MOSFET and a source terminal connected to the second power source, the second switching circuit includes a third n-channel MOSFET having a drain terminal connected to the drain terminal of the first n-channel MOSFET and a source terminal connected to the first power source, the third switching circuit includes a fourth n-channel MOSFET having a drain terminal connected to the drain terminal of the second n-channel MOSFET and a source terminal connected to the first power source, and the third p-channel MOSFET, the third n-channel MOSFET, and the fourth n-channel MOSFET, operate in response to a first control signal for making the sense amplifier active, the first control signal being applied to the gate terminals of the third p-channel and n-channel MOSFETs and the fourth n-channel MOSFET.

The first input signal line is connected to a plurality of memory cells and to the second power source via a drain-source path of one of a fifth p-channel MOSFET and a fifth n-channel MOSFET, and the second input signal line is connected to the plurality of memory cells and to the second power source via a drain-source path of one of a sixth p-channel MOSFET and a sixth n-channel MOSFET.

According to a further aspect of the present invention, there is provided an SRAM having a two-stage configuration sense system with a main sense amplifier and local sense amplifiers of the type that data in a memory cell selected by a decoder is amplified by a local sense amplifier of a block corresponding to the selected memory cell and the amplified data is sent as a pair of complementary signals to data buses via a block selector controlled by the decoder, wherein the block selector reduces a voltage swing of the complementary signals, the local sense amplifier is connected via the data buses to the sense amplifier of the present invention, the sense amplifier being used as the main sense amplifier and having a pair of input terminals corresponding to the pair of complementary signals.

According to a still further aspect of the present invention, there is provided a microprocessor having the sense amplifier of the present invention, the microprocessor having an SRAM formed in the same chip of the microprocessor.

According to the sense amplifier of the present invention, when the outputs of the sense amplifier are established once, a p-channel MOSFET (MP1) and n-channel MOSFET (MN2), or a p-channel MOSFET (MP2) and n-channel MOSFET (MN1), turn off so that no d.c. current path is formed, and the power consumed by the sense amplifier is relatively small.

Moreover, the sense amplifier of the present invention does not drive pairs of bit lines BL and /BL, allowing a high speed sense operation even if a large number of memory cells are connected to the bit lines. The reason why the sense amplifier does not drive bit lines is as follows. As shown in FIG. 1, one of the complementary output signal terminals OUT and /OUT on which the low level GND appears is disconnected from the corresponding one of the bit lines BL and /BL by the drain-source path of the p-channel MOSFET (MP1 or MP2) so that the bit line will not undergo the potential transition which would be otherwise caused by the output signal transition. For example, when the low level is outputted to the terminal /OUT, MP2 is applied with a high level signal at its gate and turns off, so that the potential change by the output signal transition will not occur on the bit lines. Further, although the other of the complementary output signal terminals OUT and /OUT on which the high level Vcc appears is connected to the corresponding one of the bit lines BL and /BL by the drain-source path of the p-channel MOSFET (MP1 or MP2), this bit line has been originally set to the level Vcc. For example, when a high level signal is outputted to the terminal OUT, MP1 turns on and becomes conductive to the bit line BL. However, the bit line BL has been originally set to the high level Vcc, so that the bit line will not undergo the potential transition. In this manner, it is possible to realize a sense amplifier providing both a small power consumption and a high speed sense operation. In a two-stage configuration sense system having a main sense amplifier and local sense amplifiers, the sense amplifier of the present invention is used as the main sense amplifier. In this case, even if the voltage swing on data buses DB and /DB is reduced by a block selector, no d.c. current will flow through the main sense amplifier. Accordingly, the charge/discharge current I1 can be reduced without increasing the current I2 which would be otherwise consumed by the main sense amplifier because of the voltage swing reduction. The power consumption of the sense system can, therefore, be effectively reduced.

BRIEF DESCRIPTION OF THE DRAWINGS

FIGS. 13A to 13E explain the operation of the control signal generators shown in FIGS. 12B and 12C.

FIG. 14 is a block diagram showing the structure of a microprocessor having an SRAM and a sense amplifier according to the present invention.

DESCRIPTION OF THE PREFERRED EMBODIMENTS

Preferred embodiments of the present invention will be described with reference to the accompanying drawings.

Figure 1A:
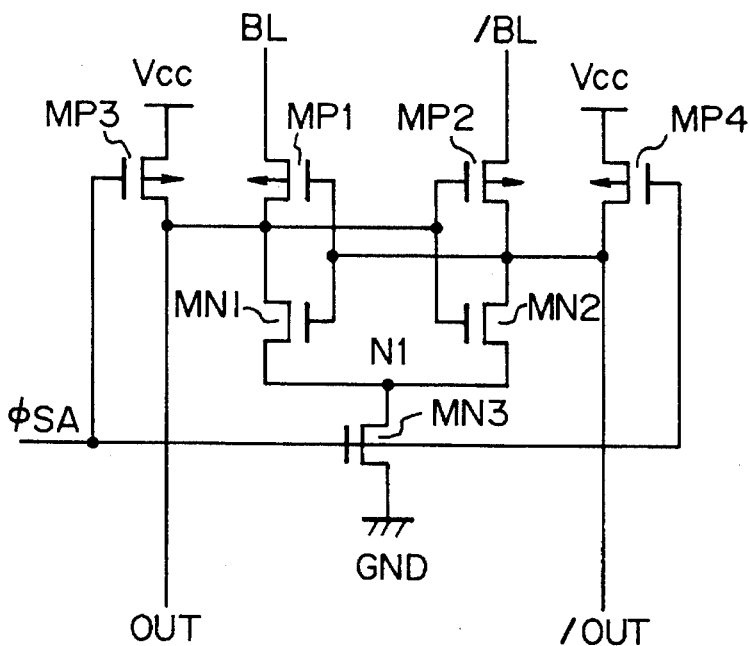
FIG. 1A is a circuit diagram of a sense amplifier according to an embodiment of the present invention.
Figure 1B:
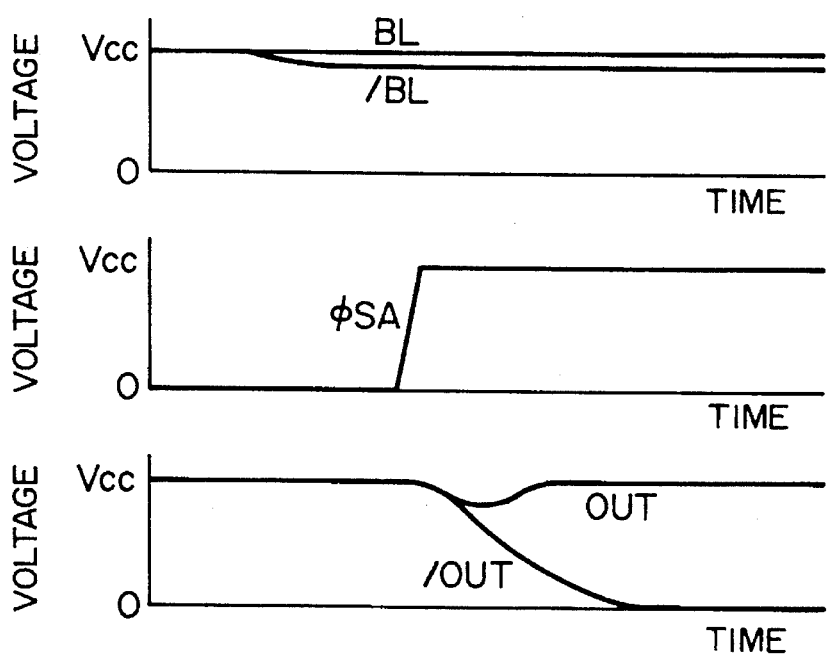
FIG. 1B is a diagram showing voltage waveforms at circuit portions of the sense amplifier shown in FIG. 1A.

FIG. 1A is a circuit diagram of a sense amplifier according to an embodiment of the present invention, and FIG. 1B is a diagram showing voltage waveforms at circuit portions of the sense amplifier shown in FIG. 1A.

Referring to FIG. 1A, symbols BL and /BL represent a pair of bit lines connected to the inputs of the sense amplifier, symbols OUT and /OUT represent complementary output signals, symbol ΦSA represents a control signal for making active or inactive the sense amplifier. When the control signal ΦSA takes a low level (GND level), p-channel MOSFETs (MP3 and MP4) turn on and the complementary output signals OUT and /OUT are held to a high level (Vcc level) (refer to OUT and /OUT in FIG. 1B). Therefore, p-channel MOSFETs (MP1 and MP2) turn off. Since an n-channel MOSFET (MN3) turns off, the potential at a node N1 is raised to the power supply voltage Vcc lower by the threshold value of n-channel MOSFETs (MN1 and MN2), turning them off.

Figure 5A:
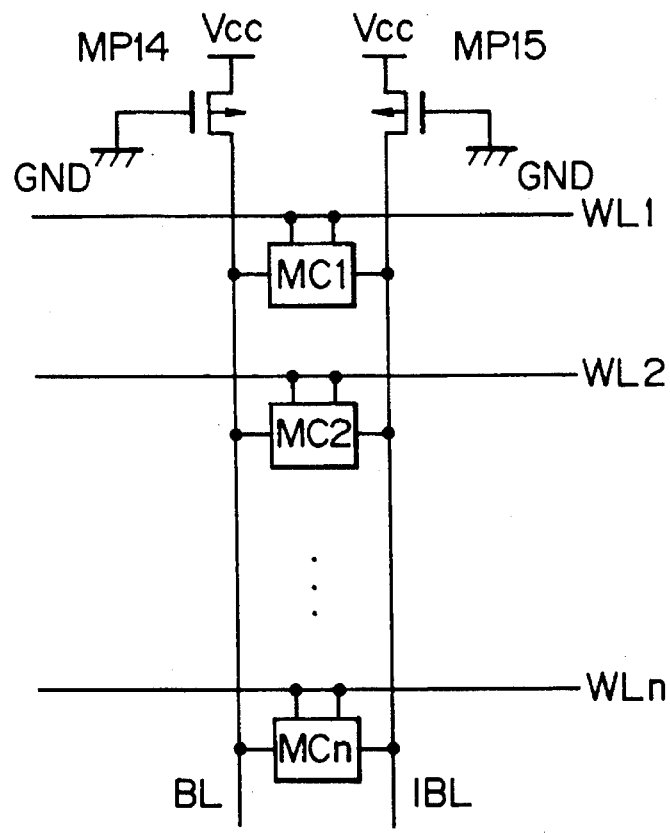
FIG. 5A is a schematic circuit diagram showing bit lines and associated circuit portions to which the present invention is applicable.
Figure 5B:
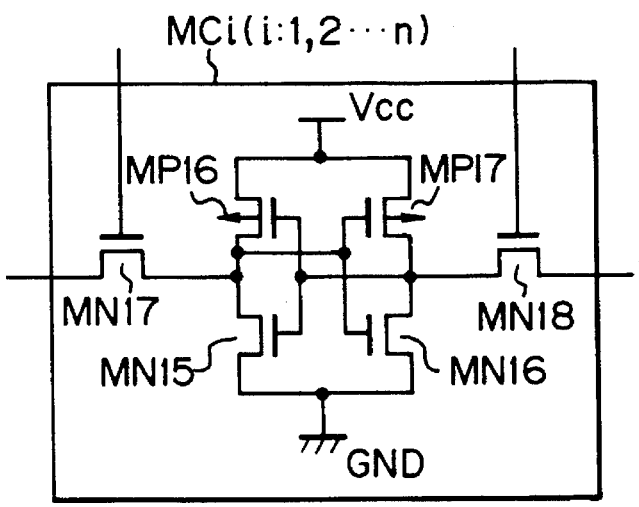
FIG. 5B is a circuit diagram showing a memory cell shown in FIG. 5A.

FIG. 5A is a schematic diagram showing bit lines of an SRAM applicable to the present invention, and FIG. 5B is a circuit diagram of a memory cell to be connected to the bit lines shown in FIG. 5A.

As shown in FIG. 5A, a number (n) of memory cells MC1 to MCn are connected between a pair of bit lines BL and /BL. One of n word lines WL1 to WLn is set to the high level Vcc, and the other word lines are held to the low level, to select one memory cell MCi. In accordance with the binary data stored in the selected memory cell MCi, the power supply voltage Vcc appears on one of the bit lines BL and /BL and a voltage slightly lower than Vcc appears on the other of the bit lines BL and /BL (refer to BL and /BL of FIG. 1B).

When the control signal ΦSA is changed to the high level Vcc (refer to ΦSA of FIG. 1B), the n-channel MOSFETs (MN1 and MN2) turn on so that the potentials at the output terminal pair OUT and /OUT start lowering. However, there is an imbalance between the degrees of on-state of MP1 and MP2 because one of the bit lines BL and /BL is slightly high in potential. This imbalance causes another imbalance between the degrees of on-state of MN1 and MN2. For example, in FIG. 1B, assuming that BL is slightly higher in potential than /BL, the p-channel MOSFET (MP1) is relatively on the on-state side and the p-channel MOSFET (MP2) is relatively on the off-state side, leading to that the n-channel MOSFET (MN2) is relatively on and the n-channel MOSFET (MN1) is relatively off. As a result, the p-channel MOSFET (MP1) becomes further on, and the p-channel MOSFET (MP2) becomes further off. In this manner, the positive feedback is effected between the p-channel MOSFETs (MP1 and MP2) and the n-channel MOSFETs (MN1 and MN2), so that eventually the p-channel MOSFET (MP1) and n-channel MOSFET (MN2) turn on completely, and so that eventually the p-channel MOSFET (MP2) and n-channel MOSFET (MN1) turn off completely. Accordingly, the high level Vcc is outputted to OUT and the low level GND is outputted to OUT (refer to OUT and /OUT in FIG. 1B). If the potential at /BL is higher than BL, obviously the operation opposite to the above is applied.

As described above, in the sense amplifier shown in FIG. 1A, a d.c. current will not flow after the output voltages have been established. The reason for this is, as described previously, that after the outputs have been established, the p-channel MOSFET (MP1) and n-channel MOSFET (MN2) or the p-channel MOSFET (MP2) and n-channel MOSFET (MN1) are turned off so that no d.c. current path is provided. The sense amplifier of this embodiment therefore, has a relatively small power consumption, only allowing an instantaneous current to flow during switching.

Further, the sense amplifier shown in FIG. 1A does not drive the bit lines BL and /BL, allowing a high speed sense operation even if a large number of memory cells are connected to the bit lines. The reason for this is as follows. First, one of the complementary output signal terminals OUT and /OUT on which the low level GND appears is disconnected from the corresponding one of the bit lines BL and /BL by the drain-source path of the p-channel MOSFET (MP1 or MP2) so that the bit line will not undergo the potential transition to be otherwise caused by the output signal transition. Second, although the other of the complementary output signal terminals OUT and /OUT on which the high level Vcc appears is connected to the corresponding one of the bit lines BL and /BL by the drain-source path of the p-channel MOSFET (MP1 or MP2), this bit line has been set originally to the level Vcc so that the bit line will not undergo the potential transition.

The sense amplifier shown in FIG. 1A therefore provides a small power consumption and high speed sense operation.

In the sense amplifier shown in FIG. 1A, the n-channel MOSFETs and p-channel MOSFETs may be replaced by npn bipolar transistors and pnp bipolar transistors, with the same advantageous effects.

Figure 2:
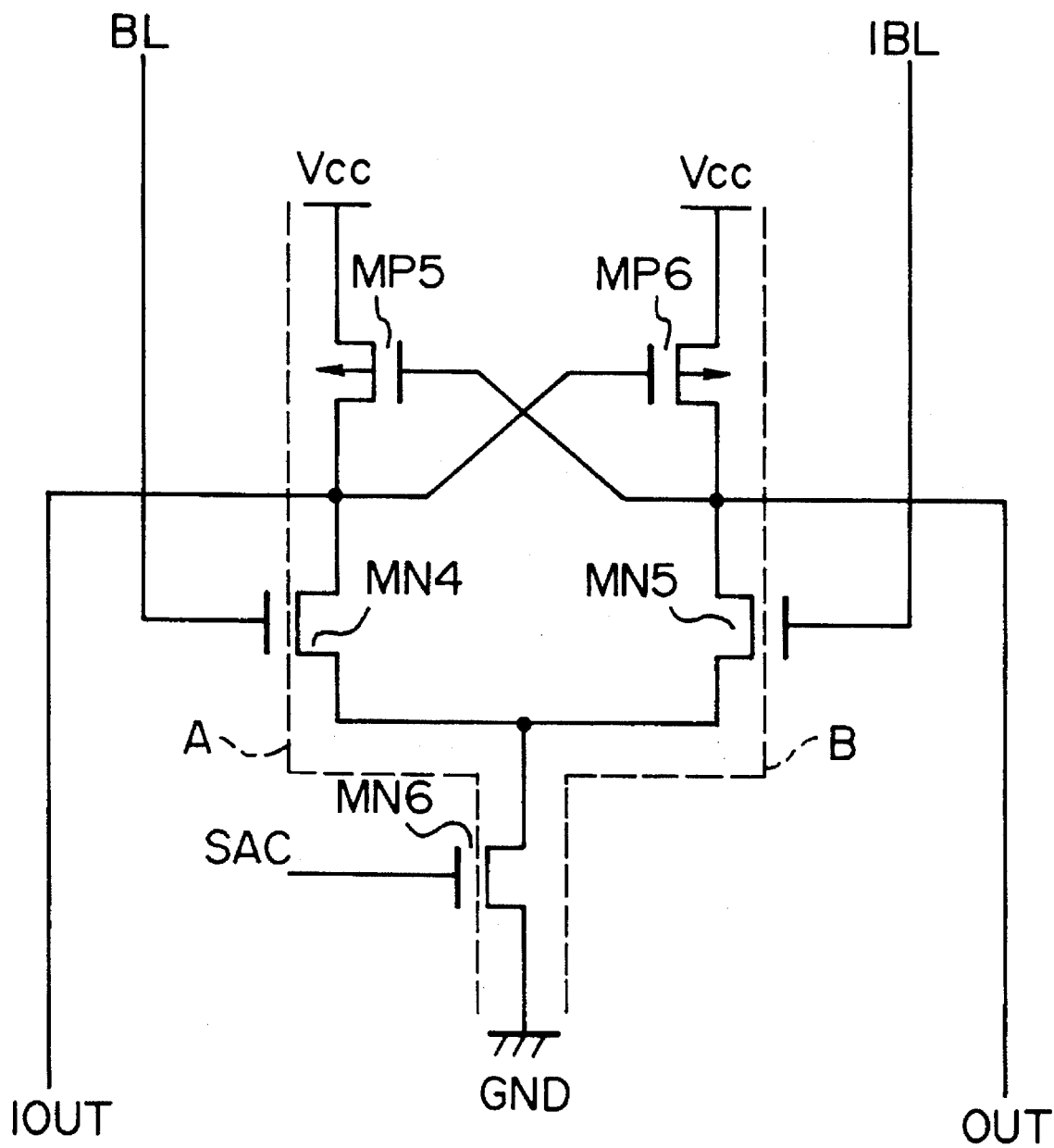
FIG. 2 is a circuit diagram of a conventional latch type sense amplifier.
Figure 3:
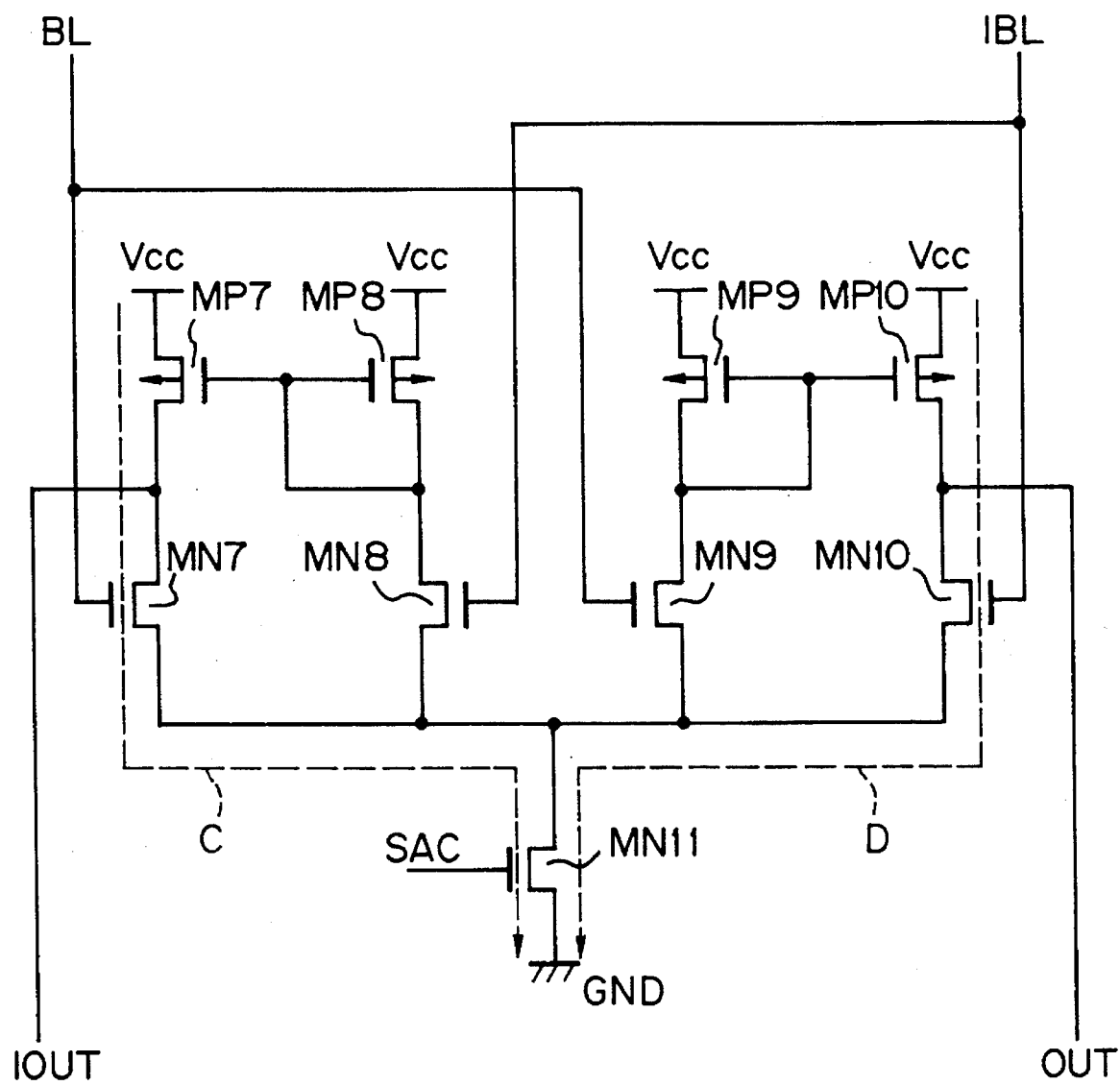
FIG. 3 is a circuit diagram of a conventional current Miller type sense amplifier.
Figure 4A:
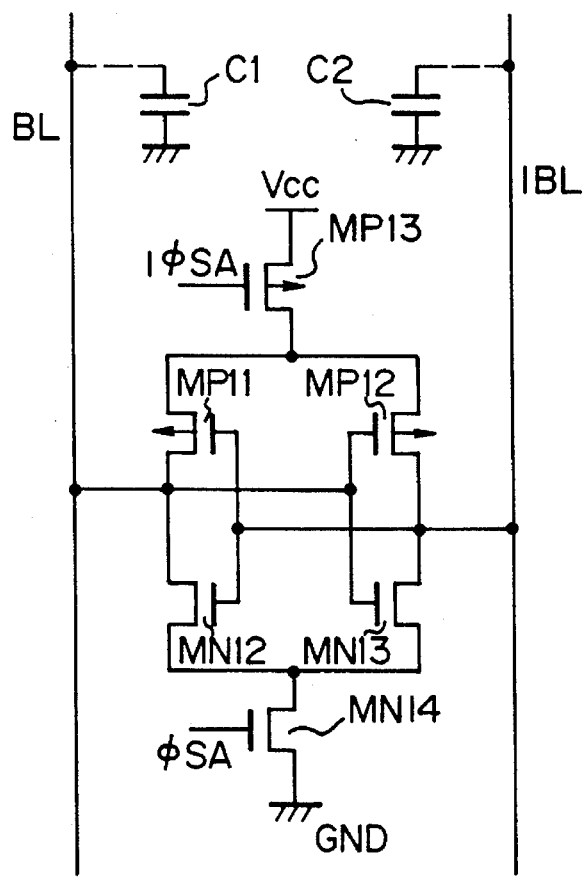
FIG. 4A is a circuit diagram of a conventional bit line output type sense amplifier.
Figure 4B:
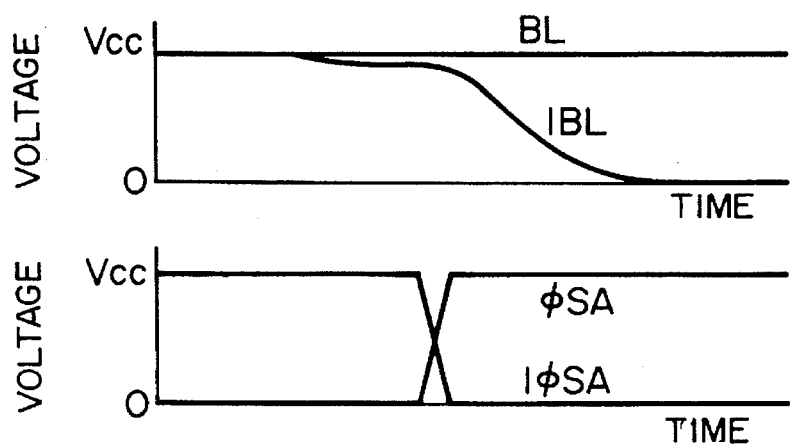
FIG. 4B is a diagram showing voltage waveforms at circuit portions of the sense amplifier shown in FIG. 4A.
Figure 8:
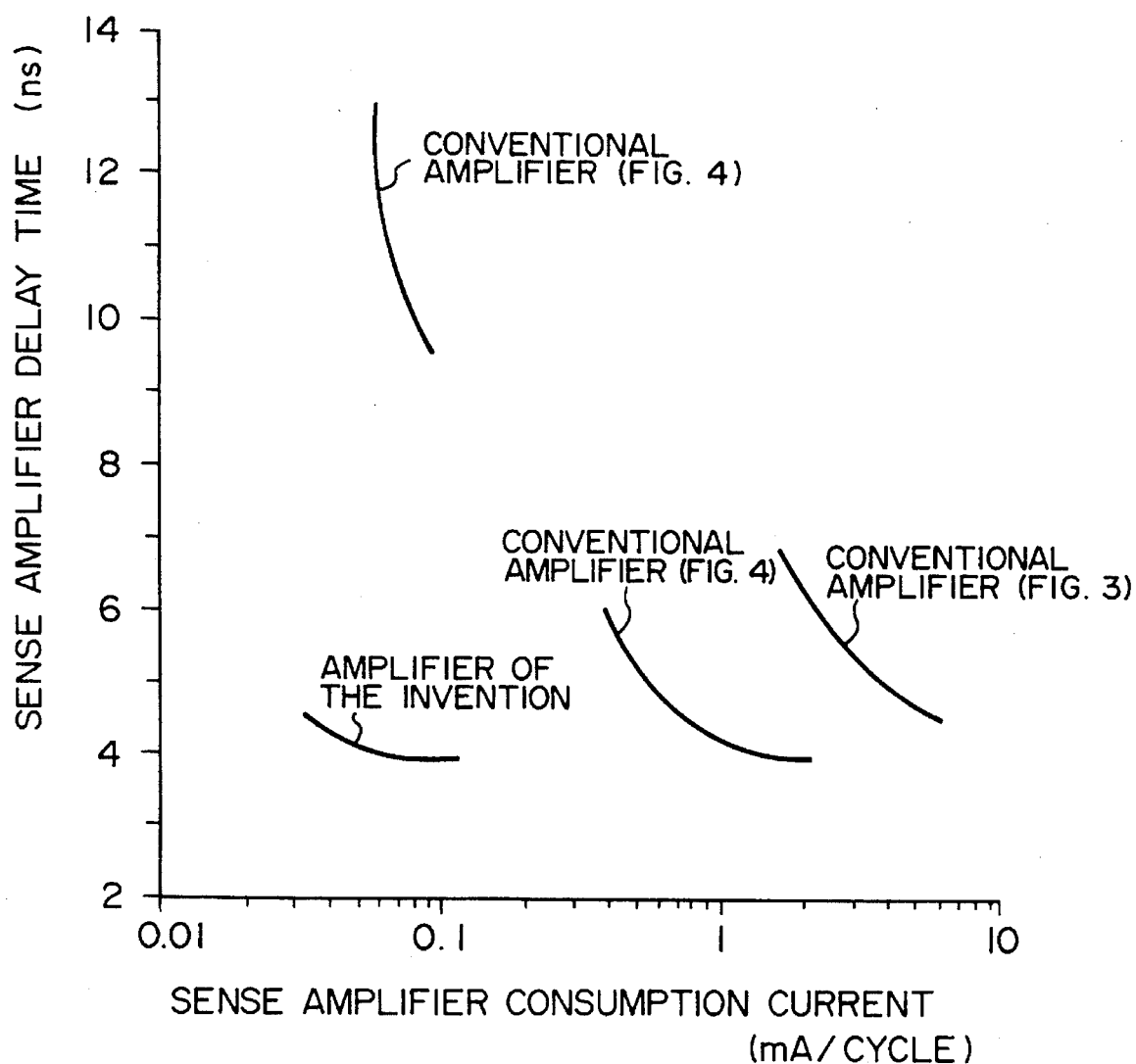
FIG. 8 is a diagram showing the characteristics of conventional sense amplifiers and a sense amplifier of the present invention.

FIG. 8 is a graph comparing the characteristics of conventional sense amplifiers and a sense amplifier according to the present invention. FIG. 8 shows the experimental results of the sense amplifier delay time relative to the sense amplifier consumption current, for the conventional sense amplifiers shown in FIGS. 2, 3, and 4A and for a sense amplifier according to the present invention. The sense amplifiers shown in FIGS. 2 and 3 have a short delay time, but they have a large consumption current. The sense amplifier shown in FIG. 4A has a small consumption current, but it has a long delay time. In contrast, the sense amplifier according to the present invention has both a small consumption current and a short delay time.

Figure 6A:
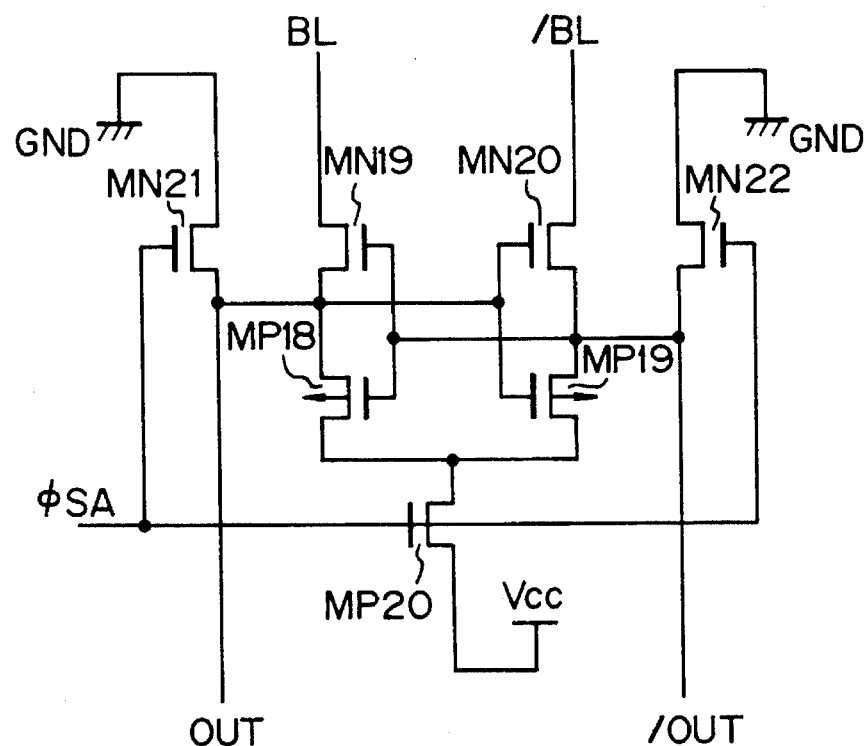
FIG. 6A is a circuit diagram of the sense amplifier according to another embodiment of the present invention.
Figure 6B:
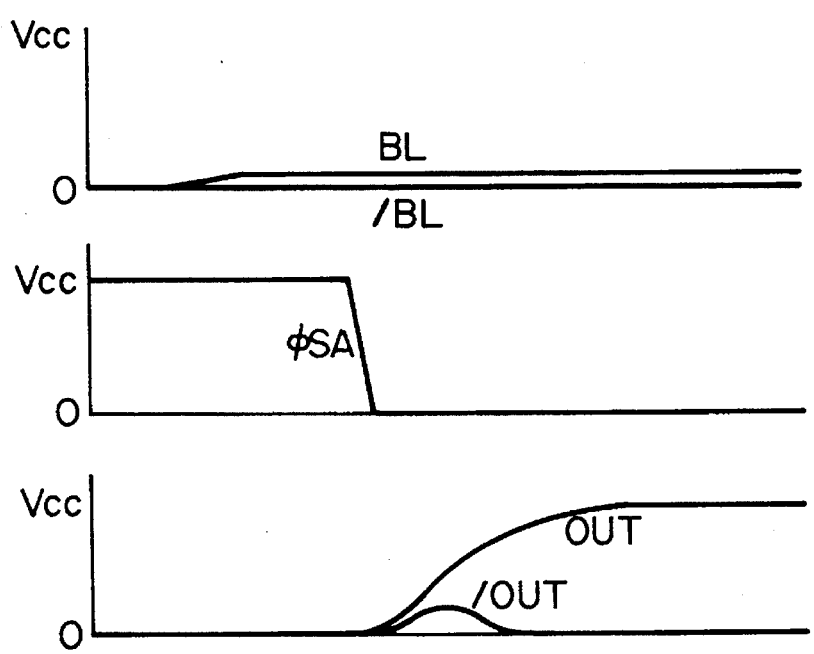
FIG. 6B is a diagram showing voltage waveforms at circuit portions of the sense amplifier shown in FIG. 6A.

FIG. 6A is a circuit diagram of the sense amplifier according to another embodiment of the present invention, and FIG. 6B shows voltage waveforms at various circuit portions of the sense amplifier shown in FIG. 6A.

In the sense amplifier shown in FIG. 6A, the polarities of MOSFETs and the power supply are reversed from those shown in FIG. 1A. The polarity of each signal is therefore reversed as shown in FIG. 6B, from that shown in FIG. 1B. The structure and operation of the sense amplifier shown in and explained with FIGS. 6A and 6B can be easily analogized from the description of the sense amplifier shown in and explained with FIGS. 1A and 1B, and so the description thereof is omitted.

Figure 7:
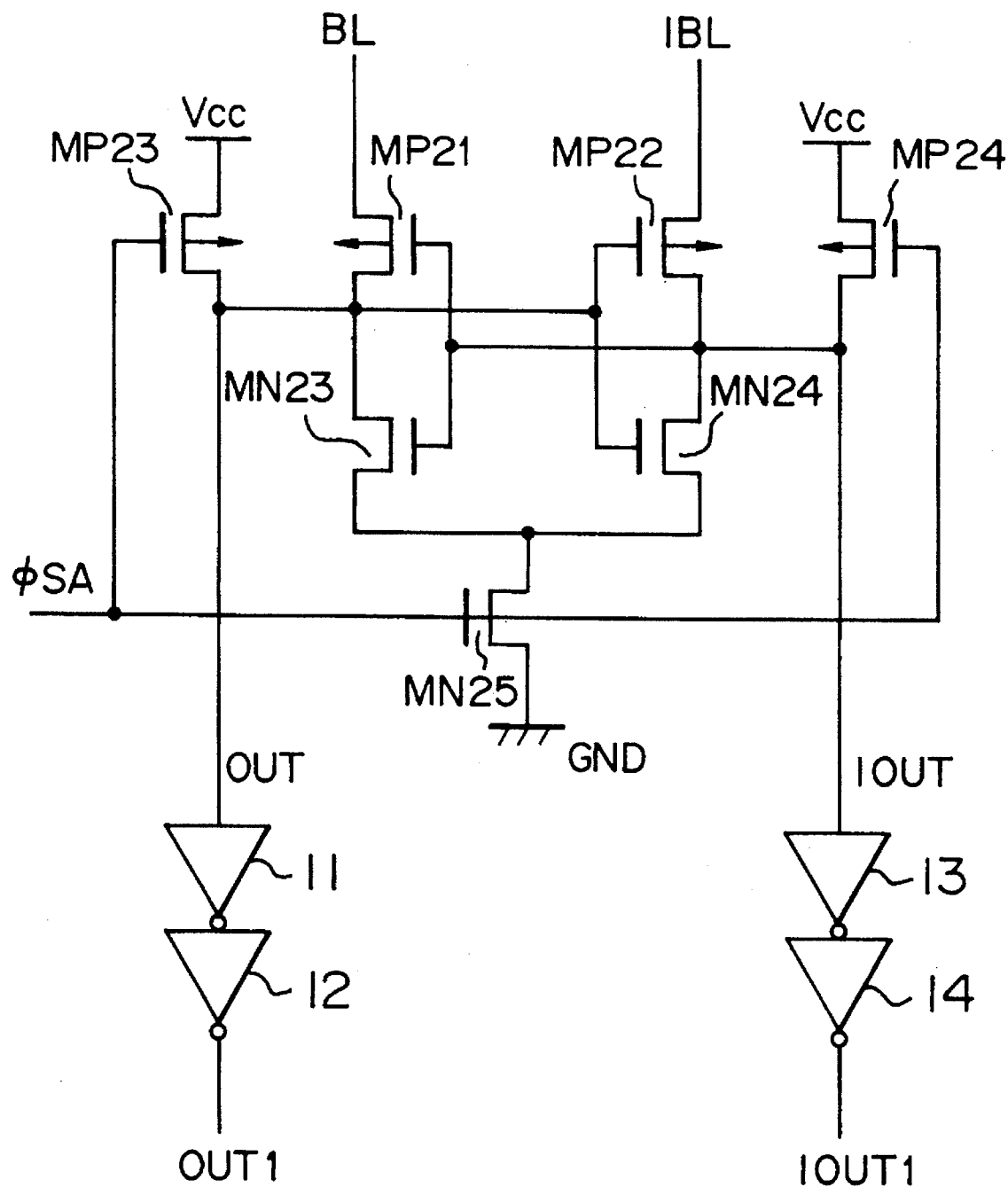
FIG. 7 is a circuit diagram of the sense amplifier according to a further embodiment of the present invention.

FIG. 7 is a circuit diagram showing a further embodiment of the sense amplifier according to the present invention.

In this embodiment, two CMOS inverters I1 and I2 are connected to the complementary output OUT and other two CMOS inverters I3 and I4 are connected to the complementary output /OUT. As shown in FIG. 5A, a number of memory cells forming a large capacitive load are connected to the outputs of the sense amplifier. In such a case, CMOS inverters are connected to the outputs of the sense amplifier to enhance a drive ability of the sense amplifier.

The number of CMOS inverters is not limited to two, but four or six inverters or more may be connected. When the signal lines from the outputs OUT and /OUT are changed to each other, one or three inverters may be used.

Figure 9:
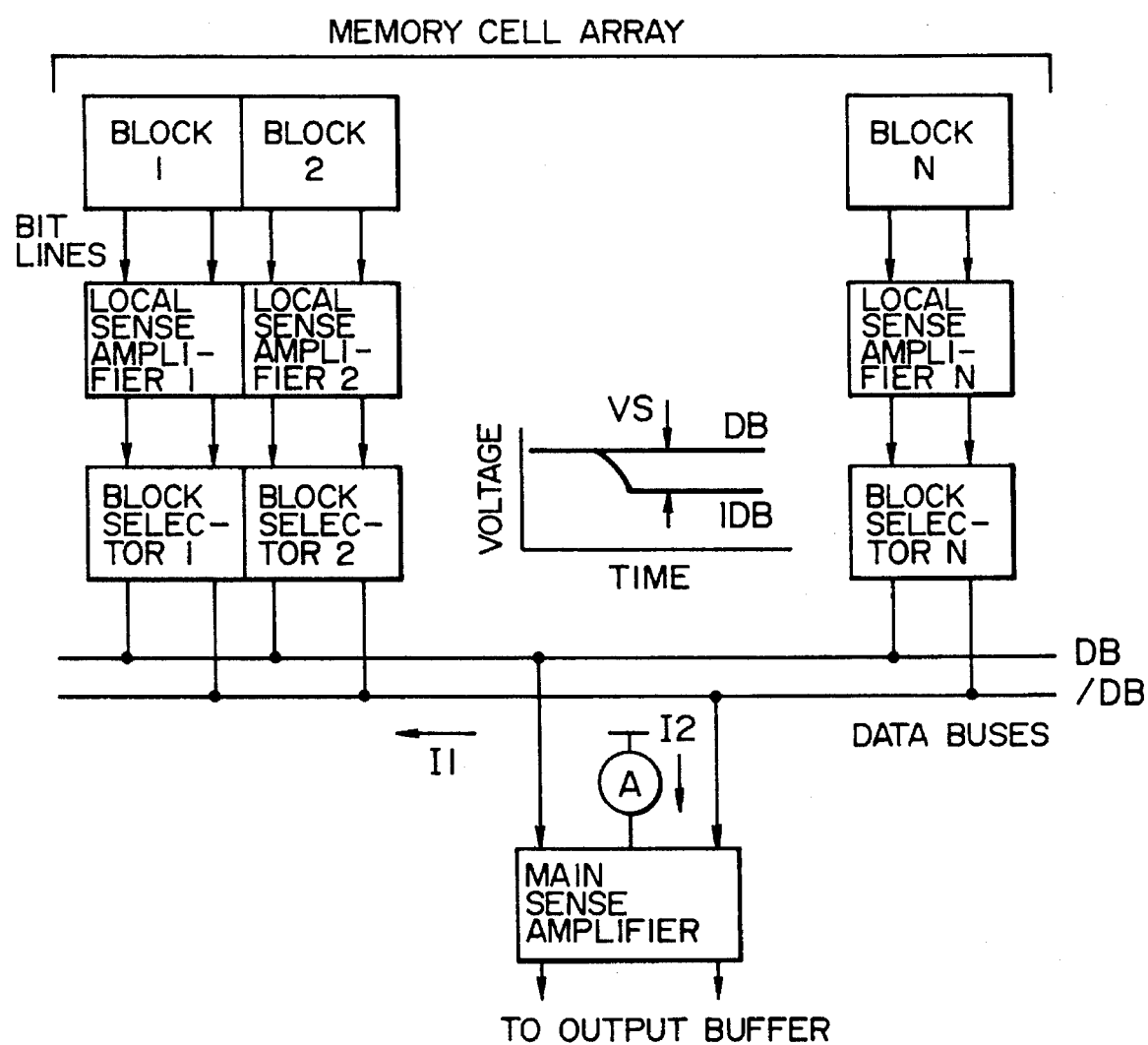
FIG. 9 is a schematic diagram showing a sense system of a two-stage configuration with a data bus voltage swing reduction according to the present invention.

The power consumption of the sense system having a two-stage configuration shown in and described with FIG. 9 can be reduced effectively by reducing a voltage swing on data buses DB and /DB and by applying the present invention to the main sense amplifier. For example, the block selector shown in FIG. 9 is provided with a circuit for reducing a voltage swing on data buses, such as circuits shown in FIGS. 10A and 10B. With this circuit, the current I1 flowing during the charge/discharge of the data busses can be reduced in proportion with the voltage swing (VS). Since there is no d.c. current flowing in the main sense amplifier of the present invention, the current I2 consumed by the main sense amplifier is maintained at a small level independently from the voltage swing. It is, therefore, possible to effectively reduce the consumption current of the sense system by reducing the voltage swing on the data buses DB and /DB.

Figure 11:
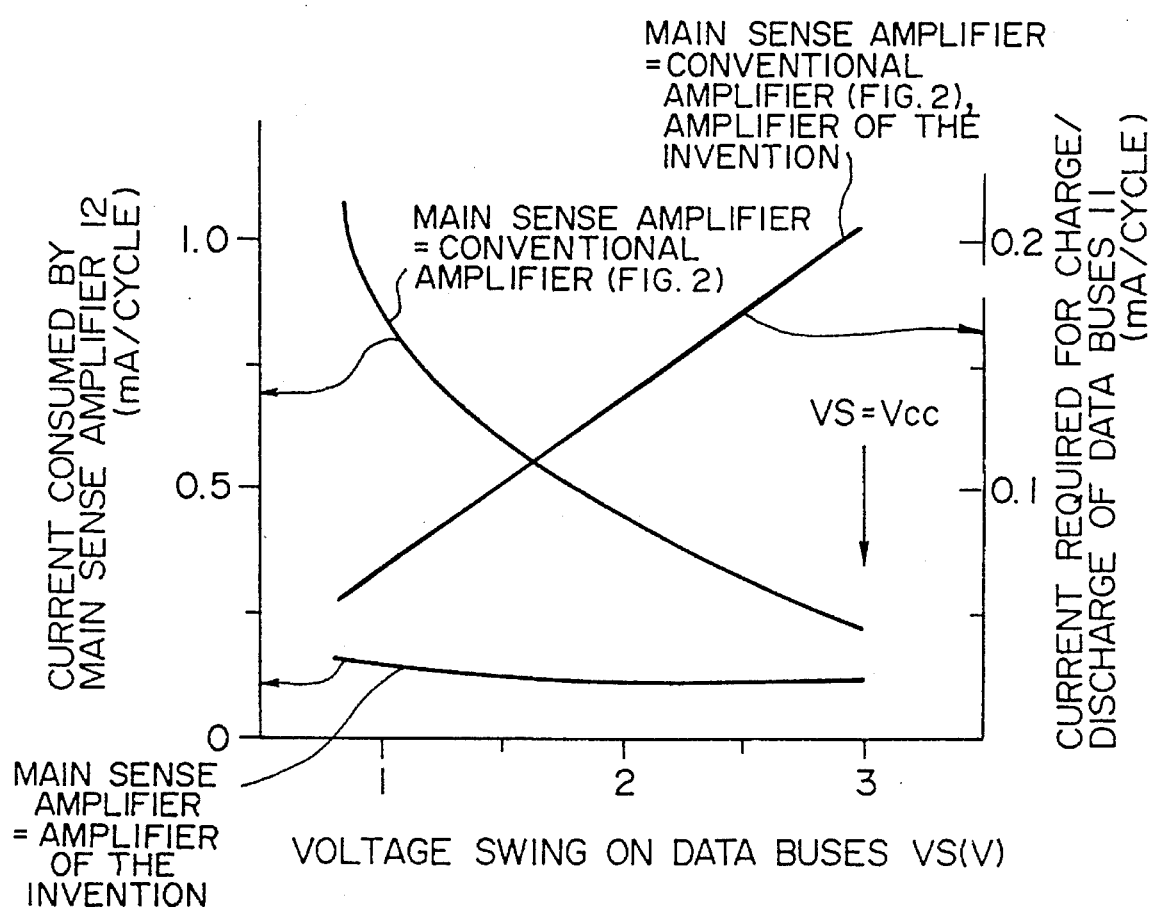
FIG. 11 is a graph showing the characteristic of the two-stage configuration sense system shown in FIG. 9.

FIG. 11 shows the characteristics of the two-stage configuration sense system with a voltage swing reduction on data buses according to the present invention.

The characteristics shown in FIG. 11 indicate that the current value I1 by the charge/discharge of data buses increases proportionally with the voltage swing VS changing from 0 to Vcc. The characteristics are the same for both a main sense amplifier of the present invention and a conventional main sense amplifier.

The characteristics shown in FIG. 11 also indicate the consumption current I1 relative to the voltage swing VS changing from 0 to Vcc. In the case of the conventional sense amplifier shown in FIG. 2, the consumption current I2 lowers gradually as the voltage swing VS is reduced. In contrast, the consumption current by the sense amplifier of the present invention shown in FIG. 1 maintains substantially a constant value irrespective of the voltage swing on data buses.

The circuits shown in FIGS. 10A and 10B will now be described.

Figure 10A:
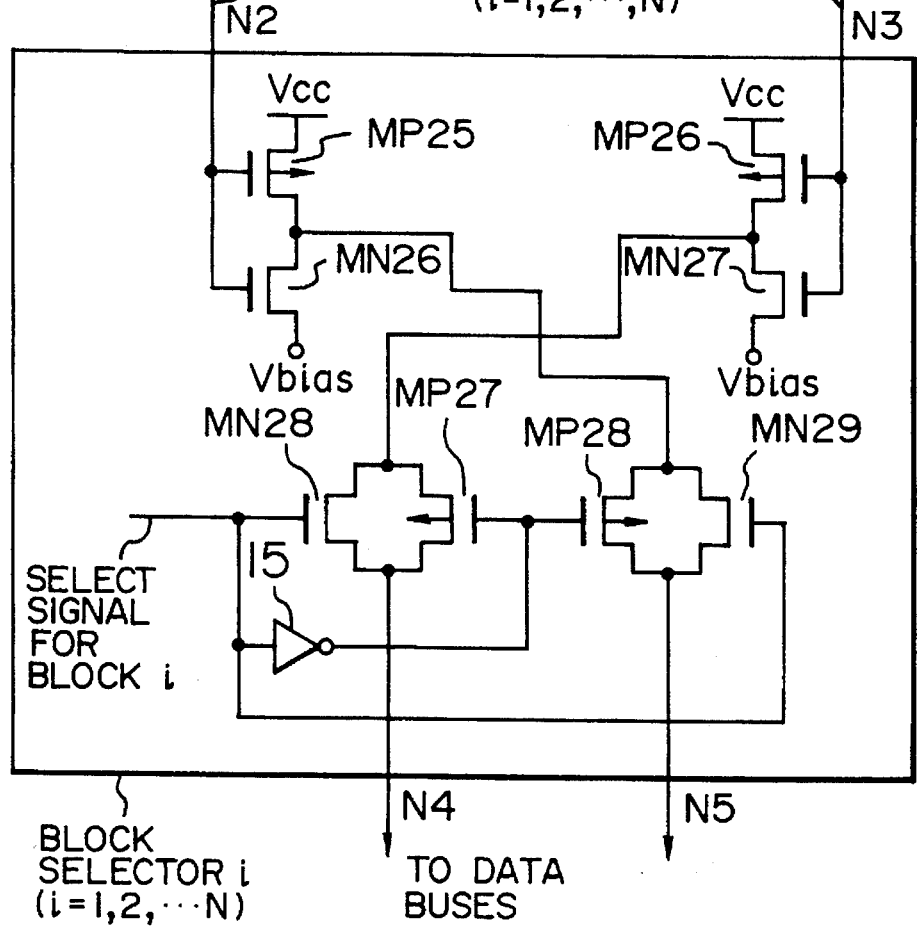
FIGS. 10A and 10B show examples of a voltage swing reduction circuit added to a block selector according to the present invention.

In the circuit shown in FIG. 10A, a voltage $V_{bias}$ (0 V<$V_{bias}$<Vcc) generated in the chip or outside of the chip is used. The voltage swing of complementary signals (amplitude=Vcc) outputted from a local sense amplifier i (i=1 to n) and inputted to nodes N2 and N3 is reduced by two CMOS inverters constituted by a p-channel MOSFET (MP25) and an n-channel MOSFET (MN26) and by a p-channel MOSFET (MP26) and an n-channel MOSFET (MN27). Namely, the voltage swing of 0 to Vcc is reduced to a voltage swing of $V_{bias}$ to Vcc, with the high level of Vcc and the low level of $V_{bias}$. When a select signal for the block i becomes high level (Vcc), the output signals from the CMOS inverters are supplied to n-channel MOSFETs (MN28 and MN29) and p-channel MOSFETs (MP27 and MP28) and outputted to nodes N4 and N5, respectively.

Figure 10B:
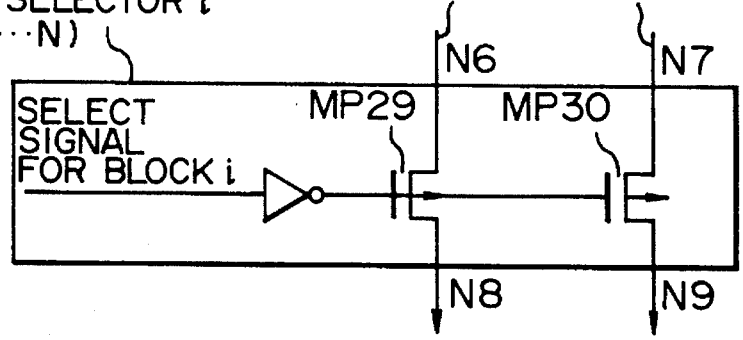

In the circuit shown in FIG. 10B, a threshold value of p-channel MOSFETs (MP29 and MP30) is used for reducing the voltage swing in a simpler manner. Specifically, when a select signal for the block i becomes high level (Vcc), complementary signals (amplitude=Vcc) inputted to nodes N6 and N7 are outputted via the source-drain paths of the p-channel MOSFETs (MP29 and MP30) to nodes N8 and N9, respectively. Even if the potential at the node N8 or N9 goes down to 0 V (GND), the potential at node N8 or N9 lowers only to the threshold voltage Vth of the p-channel MOSFETs (MP29 and MP30). Therefore, the output voltage swing on data buses is reduced to Vcc–Vth, with the low level of Vth and the high level of Vcc, where Vth is positive and the threshold value of MP29 and MP30 is –Vth.

Figure 12A:
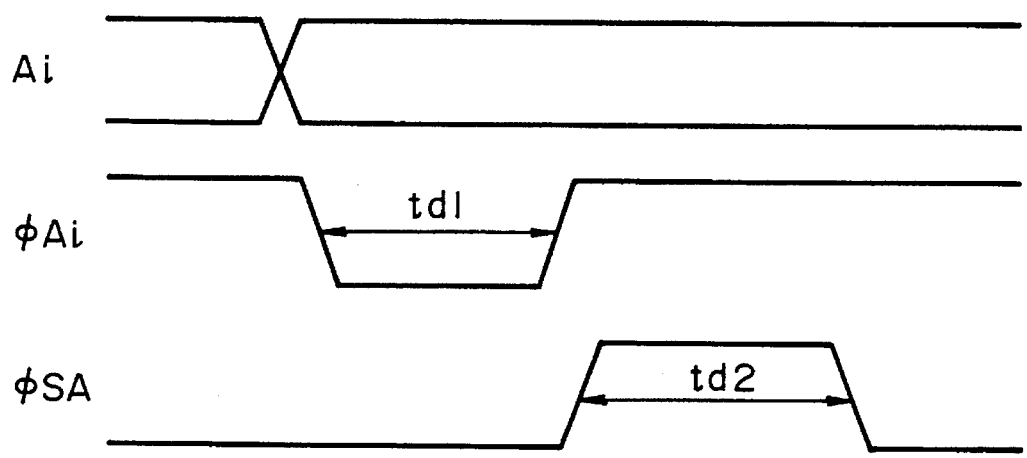
FIGS. 12A to 12C show waveforms at circuit portions of control signal generators to be used by the sense amplifier of the present invention, and the structures of the control signal generators.
Figure 12B:
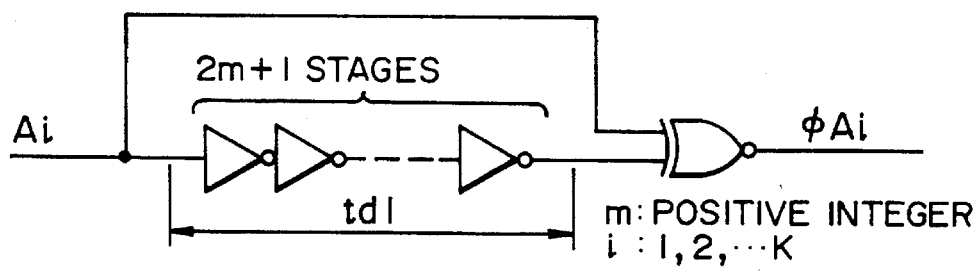
Figure 12C:
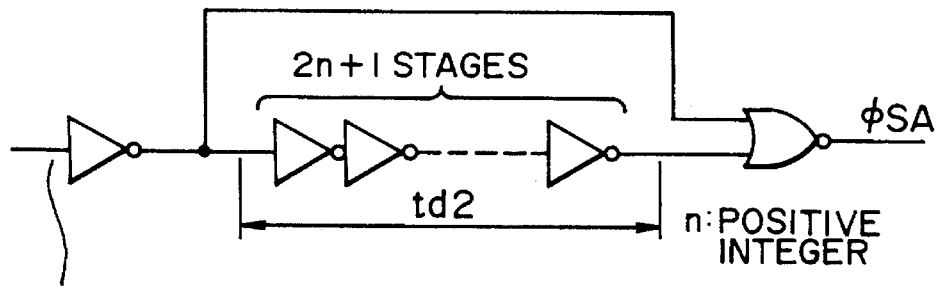

FIGS. 12A to 12C illustrate how the control signal ΦSA to be used in the sense amplifier of the present invention is generated in an SRAM chip.

FIG. 12A shows waveforms at circuit portions of a control signal generator to be used by the sense amplifier of the present invention, FIG. 12B shows the structure of a ΦAi signal generator, and FIG. 12C shows the structure of a ΦSA control signal generator.

In FIG. 12A, Ai (i=1 to k) is an address signal, and ΦAi is a signal which takes a low level (GND) for a predetermined period (td1) immediately after the transition of an address signal Ai. By using the ΦAi signal, the control signal ΦSA taking a high level for a predetermined period (td2) can be generated. By using all ΦAi signals, the control signal ΦSA is generated which makes the sense amplifier active after a lapse of a predetermined period (slightly longer than td1) from when the address signal Ai has been established, and makes it inactive after a lapse of the predetermined period (td2).

In the ΦAi signal generator shown in FIG. 12B, an address signal Ai is inputted to one input terminal of an EXNOR gate, and the address signal Ai passed through a delay circuit of 2 m+1 inverters is inputted to the other terminal of the EXNOR gate. The integer m is determined so as to produce the delay time td1 of the delay circuit. In the ΦSA signal generator shown in FIG. 12C, a logical product of ΦA1, ΦA2, . . . , ΦAi, . . . , ΦAk is inputted via an inverter to one input terminal of a NOR gate, and an output of the inverter passed through a delay circuit of 2 n+1 inverters is inputted to the other input terminal of the NOR gate. The integer n is determined so as to produce the delay time td2.

FIGS. 13A to 13E explain the operation of the signal generators shown in FIGS. 12B and 12C. The logic of the EXNOR gate shown in FIG. 12B is shown in FIG. 13A. The address signal Ai inputted to one input terminal of the EXNOR gate of FIG. 12B has a waveform shown in FIG. 13B, and the delayed address signal Ai' inputted to the other input terminal has a waveform shown in FIG. 13C which falls at the timing delayed by td1 from the rising edge of the address signal Ai. An output of the EXNOR signal or the ΦAi signal takes a high level "1" only when the two inputs Ai and Ai' are "0" and "0", or "1" and "1" (refer to FIG. 13D). The logical product signal inputted to one input terminal of the NOR gate is a signal shown in FIG. 13D delayed slightly by the inverter, and the delayed logical sum signal inputted to the other input terminal is a signal delayed further by td2. Therefore, the output signal SA has a waveform shown in FIG. 13E.

FIG. 14 is a schematic block diagram showing an embodiment of a microprocessor according to the present invention.

The microprocessor 11 has an SRAM 12 assembled with the sense amplifier of the present invention. The microprocessor 11 includes an arithmetic and control unit 13, a memory 12, and a bus interface 14, respectively interconnected by an internal bus 15.

As described, for example, in an article entitled "ISSCC Digest of Technical Papers", February 1992, pp. 106–107, there is known a highly sophisticated microprocessor having a wide internal bus such as 32 bits and 64 bits. Generally, data read from the memory 12 to the internal bus 15 is performed in parallel for all bits. It is, therefore necessary for the memory 12 to have as many sense amplifiers as the number of bits of the internal bus 15. As the width of the internal bus 15 of the microprocessor 11 becomes great, SRAM 12 is required to have a great number of sense amplifiers. The sense amplifier of the present invention provides both a low power consumption and a high speed sense operation. It, is therefore, possible to read such an SRAM 12 at a high speed and with a low power consumption by using sense amplifiers of the present invention. The microprocessor 11 can, therefore, operate at a high speed and with a low power consumption.

As described so far, according to the present invention, it is possible to realize a sense amplifier, an SRAM, and a microprocessor having both a low power consumption and a high speed sense operation. Furthermore, in the two-stage configuration sense system using a main sense amplifier and local sense amplifiers, a d.c. current will not flow through the main sense amplifier even if the voltage swing on data buses connecting the main sense amplifier and local sense amplifiers is reduced. Accordingly, the total power consumption of the sense system can be reduced efficiently.

What is claimed is:

1. A sense amplifier for an SRAM comprising:

a first p-channel MOSFET having a source terminal connected to a first input signal line;

a second p-channel MOSFET having a source terminal connected to a second input signal line;

a first n-channel MOSFET having a drain terminal connected to a drain terminal of said first p-channel MOSFET and a gate terminal connected to a drain terminal of said second p-channel MOSFET and to a gate terminal of said first p-channel MOSFET;

a second n-channel MOSFET having a drain terminal connected to said drain terminal of said second p-channel MOSFET, a gate terminal connected to said drain terminal of said first p-channel MOSFET and to a gate terminal of said second p-channel MOSFET, and a source terminal connected to a source terminal of said first n-channel MOSFET;

a first switching circuit for controlling the connection/disconnection between a first power source and said source terminal of said first n-channel MOSFET;

a second switching circuit for controlling the connection/disconnection between a second power source and said drain terminal of said first p-channel MOSFET; and a third switching circuit for controlling the connection/disconnection between said second power source and said drain terminal of said second p-channel MOSFET.

2. A sense amplifier according to claim 1, wherein:

said first switching circuit includes a third n-channel MOSFET having a drain terminal connected to said source terminal of said first n-channel MOSFET and a source terminal connected to said first power source;

said second switching circuit includes a third p-channel MOSFET having a drain terminal connected to said drain terminal of said first p-channel MOSFET and a source terminal connected to said second power source;

said third switching circuit includes a fourth p-channel MOSFET having a drain terminal connected to said drain terminal of said second p-channel MOSFET and a source terminal connected to said second power source; and said third n-channel MOSFET, said third p-channel MOSFET, and said fourth p-channel MOSFET, operate in response to a first control signal for making said sense amplifier active, said first control signal being applied to the gate terminals of said third n-channel and p-channel MOSFETs and said fourth p-channel MOSFET.

3. A sense amplifier for an SRAM comprising:

a first n-channel MOSFET having a source terminal connected to a first input signal line;

a second n-channel MOSFET having a source terminal connected to a second input signal line;

a first p-channel MOSFET having a drain terminal connected to a drain terminal of said first n-channel MOSFET and a gate terminal connected to a drain terminal of said second n-channel MOSFET and to a gate terminal of said first n-channel MOSFET;

a second p-channel MOSFET having a drain terminal connected to said drain terminal of said second n-channel MOSFET, a gate terminal connected to said drain terminal of said first n-channel MOSFET and to a gate terminal of said second n-channel MOSFET, and a source terminal connected to a source terminal of said first p-channel MOSFET;

a first switching circuit for controlling the connection/disconnection between a second power source and said source terminal of said first p-channel MOSFET;

a second switching circuit for controlling the connection/disconnection between a first power source and said drain terminal of said first n-channel MOSFET; and a third switching circuit for controlling the connection/disconnection between said first power source and said drain terminal of said second n-channel MOSFET.

4. A sense amplifier according to claim 3, wherein:

said first switching circuit includes a third p-channel MOSFET having a drain terminal connected to said source terminal of said first p-channel MOSFET and a source terminal connected to said second power source;

said second switching circuit includes a third n-channel MOSFET having a drain terminal connected to said drain terminal of said first n-channel MOSFET and a source terminal connected to said first power source;

said third switching circuit includes a fourth n-channel MOSFET having a drain terminal connected to said drain terminal of said second n-channel MOSFET and a source terminal connected to said first power source; and said third p-channel MOSFET, said third n-channel MOSFET, and said fourth n-channel MOSFET, operate in response to a first control signal for making said sense amplifier active, said first control signal being applied to the gate terminals of said third p-channel and n-channel MOSFETs and said fourth n-channel MOSFET.

5. A sense amplifier according to claim 1, wherein said first input signal line is connected to a plurality of memory cells and to said second power source via a drain-source path of one of a fifth p-channel MOSFET, and said second input signal line is connected to said plurality of memory cells and to said second power source via a drain-source path of one of a sixth p-channel MOSFET.

6. A sense amplifier for an SRAM according to claim 1, wherein said first input signal line is connected to a first data bus, said second input signal line is connected to a second data bus, said first and second data buses are electrically connected to an output of a second sense amplifier, said first input signal line is supplied with an output signal of said second sense amplifier through said first data bus, and said second input signal line is supplied with an output signal of said second sense amplifier through said second data bus.

7. A sense amplifier for an SRAM according to claim 3, wherein said first input signal line is connected to a first data bus, said second input signal line is connected to a second data bus, said first and second data buses are electrically connected to an output of a second sense amplifier, said first input signal line is supplied with an output signal of said second sense amplifier through said first data bus, and said second input signal line is supplied with an output signal of said second sense amplifier through said second data bus.

8. A semiconductor integrated circuit comprising:

an arithmetic and control unit;

an SRAM connected to said arithmetic and control unit; and a sense amplifier for said SRAM;

wherein said sense amplifier comprises:
- a first p-channel MOSFET having a source terminal connected to a first input signal line;
- a second p-channel MOSFET having a source terminal connected to a second input signal line;
- a first n-channel MOSFET having a drain terminal connected to a drain terminal of said first p-channel MOSFET and a gate terminal connected to a drain terminal of said second p-channel MOSFET and to a gate terminal of said first p-channel MOSFET;
- a second n-channel MOSFET having a drain terminal connected to said drain terminal of said second p-channel MOSFET, a gate terminal connected to said drain terminal of said first p-channel MOSFET and to a gate terminal of said second p-channel MOSFET, and a source terminal connected to a source terminal of said first n-channel MOSFET;
- a first switching circuit for controlling the connection/disconnection between a first power source and said source terminal of said first n-channel MOSFET;
- a second switching circuit for controlling the connection/disconnection between a second power source and said drain terminal of said first p-channel MOSFET; and
- a third switching circuit for controlling the connection/disconnection between said second power source and said drain terminal of said second p-channel MOSFET.

9. A sense amplifier for an SRAM according to claim 1, wherein said first power source has a lower potential level than said second power source, said second and third switching circuits are arranged to be in a state of disconnection when said first switching circuit is in a state of connection, and said second and third switching circuits are arranged to be in a state of connection when said first switching circuit is in a state of disconnection.

10. A sense amplifier for an SRAM according to claim 3, wherein said first power source has a lower potential level than said second power source, said second and third switching circuits are arranged to be in a state of disconnection when said first switching circuit is in a state of connection, and said second and third switching circuits are arranged to be in a state of connection when said first switching circuit is in a state of disconnection.

11. A sense amplifier comprising:

a first MOSFET and a second MOSFET each having a first conductivity type channel;

a third MOSFET and a fourth MOSFET each having a second conductivity type channel;

a first input signal line and a second input signal line;

wherein, a source terminal of said third MOSFET is connected to a source terminal of said fourth MOSFET, a drain terminal of said third MOSFET is connected to a gate terminal of said second MOSFET and a gate terminal of said fourth MOSFET, a drain terminal of said fourth MOSFET is connected to a gate terminal of said first MOSFET and a gate terminal of said third MOSFET, a source-drain path of said first MOSFET is connected between said first input signal line and said drain terminal of said third MOSFET, a drain terminal of said first MOSFET is connected to said drain terminal of said third MOSFET, a drain terminal of said second MOSFET is connected to said drain terminal of said fourth MOSFET, and a source-drain path of said second MOSFET is connected between said second input signal line and said drain terminal of said fourth MOSFET;

a first switching circuit, connected to said source terminal of said third MOSFET, for controlling the enable/disable of said sense amplifier;

a second switching circuit for controlling the connection/disconnection between a power source and said drain terminal of said third MOSFET; and a third switching circuit for controlling the connection/disconnection between said power source and said drain terminal of said fourth MOSFET.

12. A sense amplifier according to claim 11, further comprising:

a second power source;

wherein said first switching circuit controls the connection/disconnection between said second power source and said source terminal of said third MOSFET.

13. A sense amplifier according to claim 11, wherein:

said first switching circuit includes a fifth MOSFET having a drain terminal connected to said source terminal of said third MOSFET and a source terminal connected to said second power source;

said second switching circuit includes a sixth MOSFET having a drain terminal connected to said drain terminal of said third MOSFET and a source terminal connected to said power source;

said third switching circuit includes a seventh MOSFET having a drain terminal connected to said drain terminal of said fourth MOSFET and a source terminal connected to said power source; and said fifth MOSFET, said sixth MOSFET and said seventh MOSFET operate in response to a first control signal for making said sense amplifier active, said first control signal being applied to the gate terminals of said fifth MOSFET and said sixth MOSFET and said seventh MOSFET.

14. A sense amplifier according to claim 12, wherein a potential of said power source is higher than a potential of said second power source.

15. A sense amplifier according to claim 13, wherein a potential of said power source is higher than a potential of said second power source.

* * * * *